United States Patent [19]
Tatsumi et al.

[11] Patent Number: 5,311,560
[45] Date of Patent: May 10, 1994

[54] FREQUENCY SYNTHESIZER

[75] Inventors: Satoshi Tatsumi; Sadao Okawa, both of Tokyo, Japan

[73] Assignee: NEC Corporation, Japan

[21] Appl. No.: 2,139

[22] Filed: Jan. 11, 1993

[30] Foreign Application Priority Data

Jan. 13, 1992 [JP] Japan ................... 4-004224

[51] Int. Cl.⁵ .............................................. H03D 3/24
[52] U.S. Cl. .................................. 375/120; 375/119; 331/25
[58] Field of Search ................. 375/106, 119, 120, 81; 331/1 A, 1 R, 17, 25; 328/63, 72; 307/527

[56] References Cited

U.S. PATENT DOCUMENTS

| | | | |
|---|---|---|---|
| 4,500,857 | 2/1985 | Bosselaers et al. | 331/17 |
| 4,520,319 | 5/1985 | Baker | 331/25 |
| 4,809,068 | 2/1989 | Nagai | 375/120 |
| 4,980,899 | 12/1990 | Troost et al. | 375/120 |
| 5,028,885 | 7/1991 | Voigt et al. | 375/120 |

Primary Examiner—Stephen Chin
Attorney, Agent, or Firm—Ostrolenk, Faber, Gerb & Soffen

[57] ABSTRACT

A frequency synthesizer which can effect a high speed frequency hopping operation without causing deterioration in stability in phase and frequency in a phase frequency-locked condition and also in output spurious characteristic is disclosed. An output range controlling circuit clips the output voltage of a phase frequency to voltage converting circuit at a voltage corresponding to an input signal. The phase frequency to voltage converting circuit outputs a voltage corresponding to a pulse width inputted thereto from a phase frequency detector. A low-pass filter removes high frequency components of a signal inputted thereto. A voltage-controlled oscillator outputs a signal having a frequency corresponding to a voltage of a signal having passed through the low-pass filter. The phase frequency detector effects phase frequency detection between a reference signal and a signal obtained by frequency dividing the output of the voltage-controlled oscillator by an arbitrary value by a variable frequency divider.

5 Claims, 3 Drawing Sheets

FREQUENCY SYNTHESIZER

BACKGROUND OF THE INVENTION

1. Field of the Invention

This invention relates to a frequency synthesizer, and more particularly to a frequency synthesizer for which a high speed frequency hopping operation is required.

2. Description of the Related art

Various frequency synthesizers are conventionally known, and an exemplary one of such conventional frequency synthesizers is shown in FIG. 3. Referring to FIG. 3, the conventional frequency synthesizer shown includes a phase frequency detector 7. The phase frequency detector 7 inputs a reference signal 6 and the output of a variable frequency divider 8, effects phase frequency detection and outputs pulse signals having pulse widths corresponding to differences in phase and frequency between the input signals to a phase frequency to voltage converting circuit 2. The phase frequency to voltage converting circuit 2 outputs a voltage corresponding to the pulse widths of the pulse signals inputted thereto to a low-pass filter 11. The low-pass filter 11 removes high frequency components of the signal inputted thereto and passes the other components of the input signal therethrough. A voltage-controlled oscillator 10 inputs the signal having passed through the low-pass filter 11 and outputs a signal having a frequency corresponding to the voltage of the signal inputted thereto to the variable frequency divider 8. The output of the voltage-controlled oscillator 10 also makes a synthesizer output 5 of the frequency synthesizer. A dividing ratio generating circuit 9 outputs a signal for controlling the dividing ratio of the variable frequency divider 8 in accordance with frequency data 4 inputted thereto to the variable frequency divider 8.

With the conventional frequency synthesizer, a high speed frequency hopping operation seems to be realized by such means as to raise the loop gain of a feedback system or to widen the passing frequency band of the low-pass filter 11. However, when any of such means is provided actually, if the hopping speed is raised, then this will result in deterioration in stability in phase and frequency in a phase frequency locked condition and also in spurious output. Accordingly, the conventional frequency synthesizer is disadvantageous in that it is difficult to achieve a high speed frequency hopping operation.

BACKGROUND OF THE INVENTION

It is an object of the present invention to provide a frequency synthesizer which can effect a high speed frequency hopping operation without causing deterioration in stability in phase and frequency in a phase frequency-locked condition and also in output spurious characteristic.

In order to attain the object, according to the present invention, there is provided a frequency synthesizer, which comprises a voltage controlled oscillator for outputting a signal of a frequency corresponding to a voltage inputted thereto, a variable frequency dividing circuit for dividing the frequency signal from the voltage controller oscillator at a variable dividing ratio, a phase frequency detector for receiving a reference signal and an output of the variable frequency dividing circuit to effect phase frequency detection, a phase frequency to voltage converting circuit for outputting a voltage in accordance with output signals of the phase frequency detector, a low-pass filter for passing a low frequency component of the output voltage of the phase frequency to voltage converting circuit therethrough to the voltage controlled oscillator, and an output range controlling circuit for clipping the output voltage of the phase frequency to voltage converting circuit at a predetermined voltage.

In the frequency synthesizer, the output voltage of the phase frequency to voltage converting circuit is controlled by the output range controlling circuit to a voltage within a predetermined range which depends upon data regarding the dividing ratio and so forth inputted by way of the output range controlling circuit. The thus controlled output voltage of the phase frequency to voltage converting circuit is inputted to the voltage controlled oscillator by way of the low-pass filter. Consequently, upon frequency leading-in, a high speed frequency hoping operation is realized by the current driving capacity of the output range controlling circuit. On the other hand, upon locking, a necessary phase stability and spurious characteristic can be achieved by keeping the loop band of the low-pass filter reduced to some degree.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
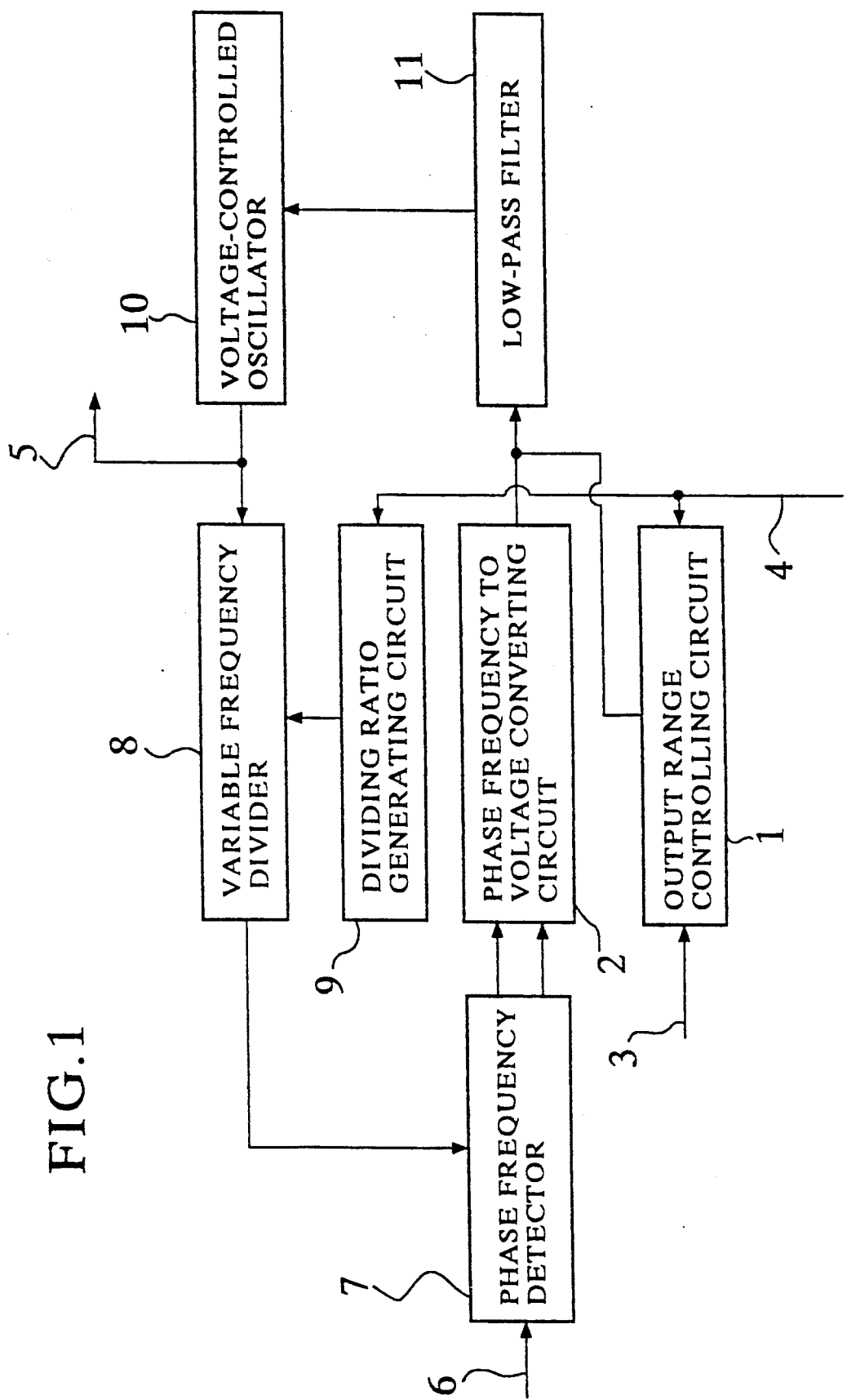
FIG. 1 is a block diagram of a frequency synthesizer showing a preferred embodiment of the present invention.
Figure 3:
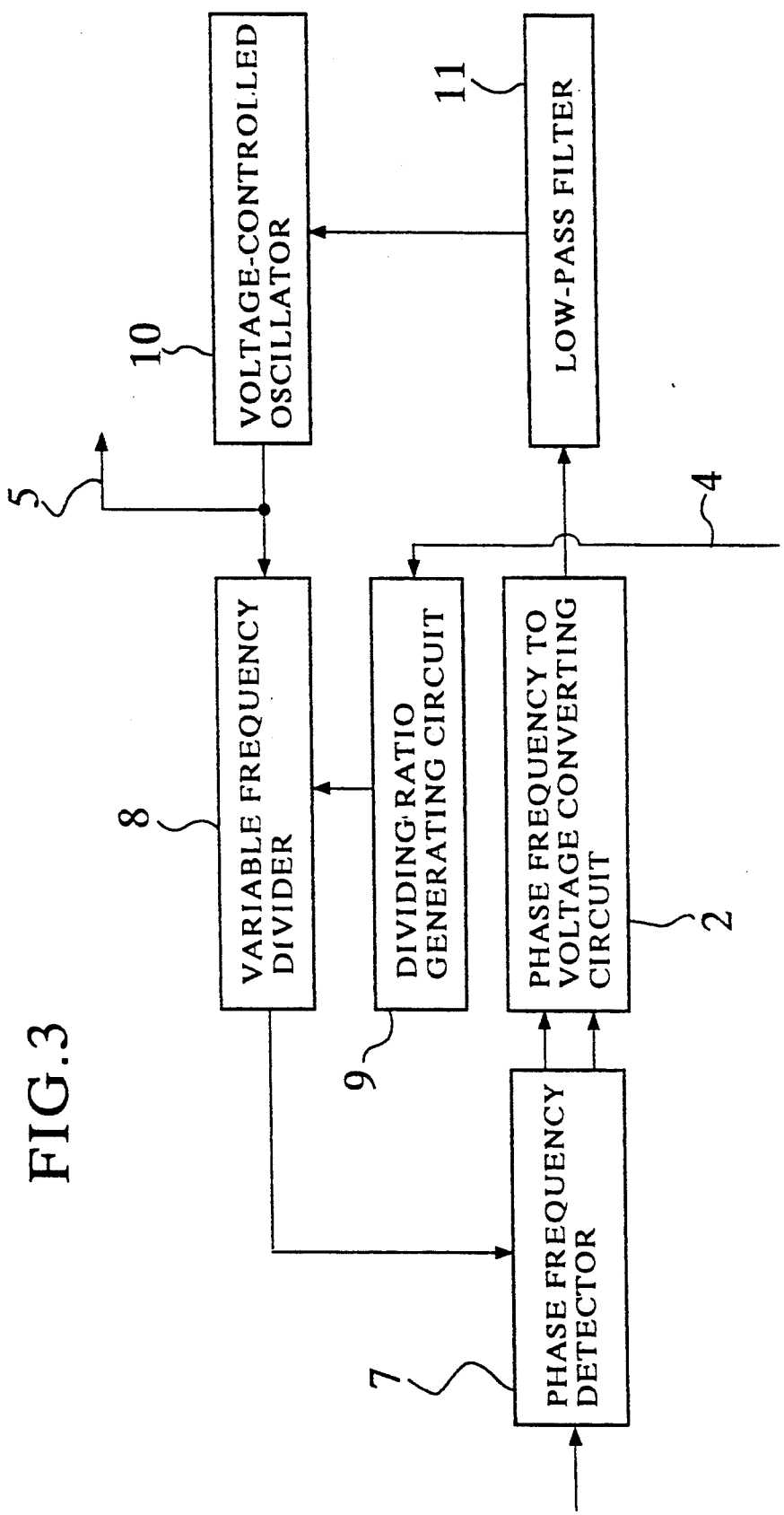
FIG. 3 is a block diagram showing an exemplary one of conventional frequency synthesizers.

Referring first to FIG. 1, there is shown a a frequency synthesizer according to a preferred embodiment of the present invention. The frequency synthesizer of the present embodiment is an improvement to the conventional frequency synthesizer described hereinabove with reference to FIG. 3 and includes a phase frequency detector 7, a phase frequency to voltage converting circuit 2, a low-pass filter 11, a voltage-controlled oscillator 10, a variable frequency divider 8 and a dividing ratio generating circuit 9 similarly to the conventional frequency synthesizer. The present frequency synthesizer is different from the conventional frequency synthesizer only in that it additionally includes an output range controlling circuit 1. The output range controlling circuit 1 inputs voltage range limiting width control data 3 and frequency data 4 from the outside and outputs an output signal to the output end of the phase frequency to voltage converting circuit 2.

Figure 2:
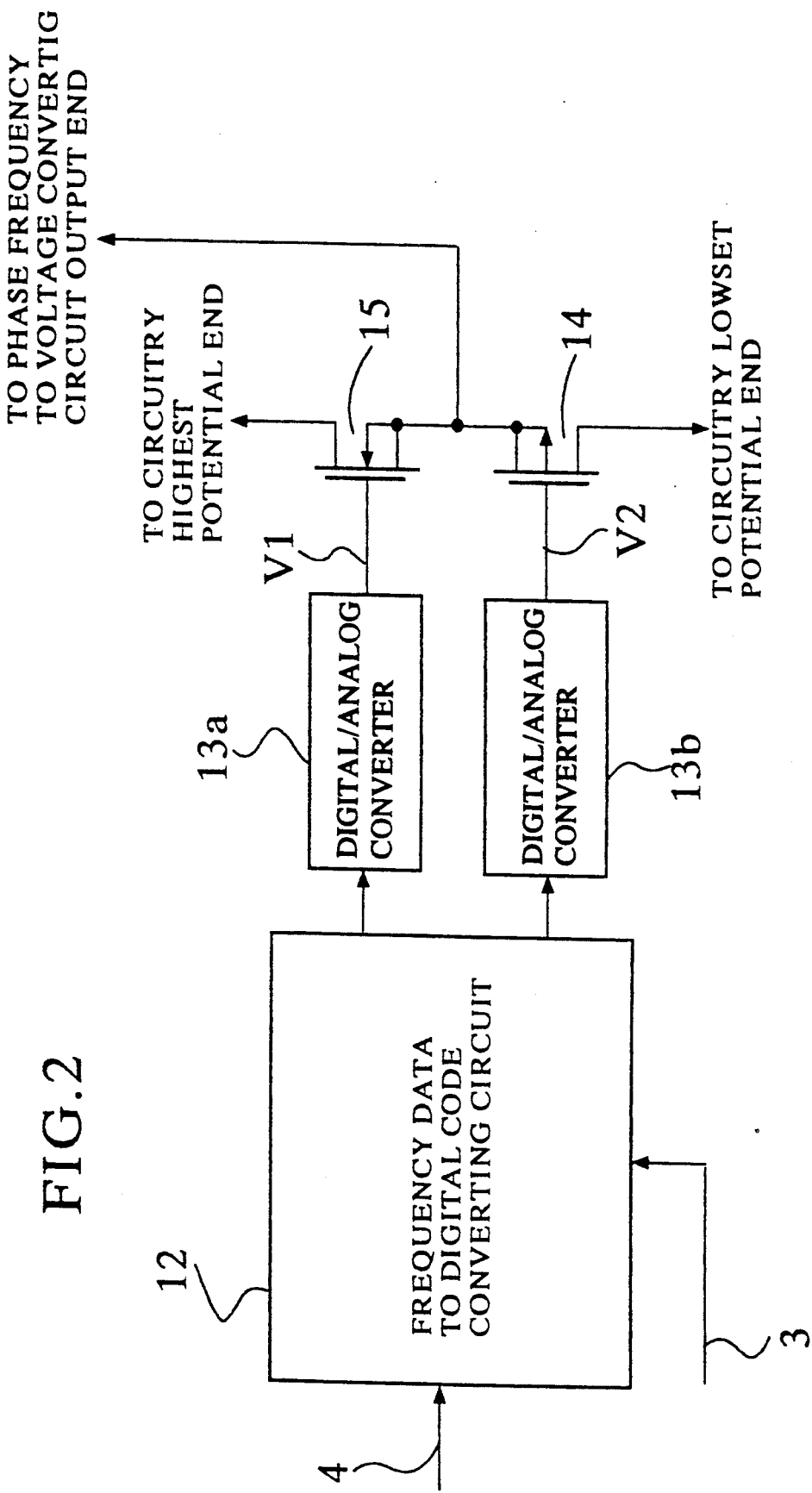
FIG. 2 is a block diagram of an output range controlling circuit of the frequency synthesizer shown in FIG. 1.

The output range controlling circuit 1 is shown in more detail in FIG. 2. Referring to FIG. 2, the output range controlling circuit 1 includes a frequency data to digital code converting circuit 12. The frequency data to digital code converting circuit 12 inputs the frequency data 4 and the voltage range limiting width control data 3, converts the input data each into a digital code of N bits and outputs the digital codes to a pair of N-bit digital to analog converters 13a and 13b, respectively. The N-bit digital to analog converter 13a thus outputs an analog voltage V1 to the gate of an n-channel MOS (metal-oxide-semiconductor) FET (field effect transistor) 15. The other N-bit digital to analog converter 13b outputs an analog voltage V2 to the gate of a p-channel MOS FET 14. The sources of the p-channel MOS FET and the n-channel MOS FET 15 are connected commonly to the output end of the phase frequency to voltage converting circuit 2 shown in FIG. 1. The drain of the n-channel MOS FET 15 is connected to the highest potential end of the circuitry while the drain of the p-channel MOS FET 14 is connected to the lowest potential end of the circuitry.

In operation, referring to FIGS. 1 and 2, the frequency data to digital code converting circuit 12 inputs voltage range limiting width control data 3 and frequency data 4, and outputs, on one hand, a digital code of N bits for controlling the lower limit of the output voltage of the phase frequency to voltage converting circuit 2 to the N-bit digital to analog converter 13a and outputs, on the other hand, another digital code of N-bits for controlling the upper limit of the output voltage of the phase frequency to voltage converting circuit 2 to the N-bit digital to analog converter 13b. The N-bit digital to analog converter 13a converts the digital input value into an analog voltage V1 and outputs it to the gate of the n-channel MOS FET 15. The other N-bit digital to analog converter 13b converts the digital input value into an analog voltage V2 and outputs it to the gate of the p-channel MOS FET 14.

Consequently, the voltage at the output end of the phase frequency to voltage converting circuit 2 which is connected to the junction between the sources of the p-channel MOS FET 14 and the n-channel MOS FET 15 is controlled so that the maximum value thereof may be equal to the (analog voltage V2)−(on-state voltage VTp (VTp<0) of the p-channel MOS FET 14) and the minimum value thereof may be equal to the (analog voltage V1)−(on-state voltage VTn of the n-channel MOS FET 15).

In this instance, when the output voltage of the phase frequency to voltage converting circuit 2 is going to transiently exceed the limiting range defined by the maximum value and the minimum value described above and controlled by the output range controlling circuit 1, either one of the p-channel MOS FET 14 and the n-channel MOS FET 15 is put into an an-state. Consequently, the MOS FET 14 or 15 clips the output voltage of the phase frequency to voltage converting circuit 2 within the limiting range while it serves also as a continuously operating current source for the low-pass filter 11 at the next stage. Accordingly, the output of the voltage controlled oscillator 10 oscillates under the frequency control of a voltage value within the limiting range which is controlled by the output range controlling circuit 1. Meanwhile, when the output voltage of the phase frequency to voltage converting circuit 2 is fluctuated within the limiting range controlled by the output range controlling circuit 1, both of the p-channel MOS FET 14 and the n-channel MOS FET 15 present an OFF state. Consequently, the output voltage of the phase frequency to voltage converting circuit 2 is determined by the feedback loop of the low-pass filter 11, voltage-controlled oscillator 10, variable frequency divider 8 and phase frequency detector 7, similarly to the conventional frequency synthesizer.

Accordingly, with the frequency synthesizer described above, upon frequency leading-in, a high frequency frequency hopping operation is realized by the frequency driving capacity of the output range controlling circuit 1. On the other hand, upon locking, a necessary phase stability and spurious characteristic can be obtained by keeping the loop band of the low-pass filter 11 reduced to some degree.

It is to be noted that, even if the p-channel MOS FET 14 of the output range controlling circuit 1 is replaced by a PNP-type bipolar transistor and the n-channel MOS FET 15 is replaced by an NPN-type bipolar transistor, the modified output range controlling circuit will operate similarly as the output range controlling circuit described hereinabove with reference to FIG. 2, and a frequency synthesizer which incorporates the modified output range controlling circuit therein will similarly achieve a high speed frequency hopping operation and a good phase stability and spurious characteristic.

Having now fully described the invention, it will be apparent to one of ordinary skill in the art that many changes and modifications can be made thereto without departing from the spirit and scope of the invention as set forth herein.

What is claimed is:

1. A frequency synthesizer, comprising:
    a voltage controlled oscillator for outputting a signal of a frequency corresponding to a voltage inputted thereto;
    a variable frequency dividing circuit for dividing the frequency signal from said voltage controlled oscillator at a variable dividing ratio;
    a phase frequency detector for receiving a reference signal and an output of said variable frequency dividing circuit to effect phase frequency detection;
    a phase frequency to voltage converting circuit for outputting a voltage in accordance with output signals of said phase frequency detector;
    a low-pass filter for passing a low frequency component of the output voltage of said phase frequency to voltage converting circuit therethrough to said voltage controlled oscillator; and
    an output range controlling circuit for clipping the output voltage of said phase frequency to voltage converting circuit to maintain it within a voltage range in accordance with said dividing ratio associated with said variable frequency dividing circuit.

2. A frequency synthesizer as claimed in claim 1, wherein said output range controlling circuit includes a data converting circuit for receiving data for controlling the dividing ratio at said variable frequency dividing circuit and outputting a digital signal in accordance with the input signals, a digital to analog converter for converting the digital signal output of said data converting circuit into an analog voltage, and a MOS field effect transistor for receiving the output signal of said digital to analog converter and clipping the output voltage of said phase frequency to voltage converting circuit at the predetermined voltage in accordance with the received output signal.

3. A frequency synthesizer as claimed in claim 1, wherein said output range controlling circuit includes a data converting circuit for receiving data for controlling the dividing ratio at said variable frequency dividing circuit and outputting a pair of digital signals in accordance with the input signals, a pair of digital to analog converters for individually converting the digital signal outputs of said data converting circuit into analog voltages, and a pair of MOS field effect transistors for individually receiving the output signals of said digital to analog converters and clipping the output voltage of said phase frequency to voltage converting circuit at two different predetermined voltages in accordance with the received output signals so that the output voltage of said phase frequency to voltage converting circuit to be applied to said low-pass filter may be within two different voltage values.

4. A frequency synthesizer as claimed in claim 1, wherein said output range controlling circuit includes a data converting circuit for receiving data for controlling the dividing ratio at said variable frequency dividing circuit and outputting a digital signal in accordance with the input signals, a digital to analog converter for converting the digital signal output of said data converting circuit into an analog voltage, and a bipolar transistor for receiving the output signal of said digital to analog converter and clipping the output voltage of said phase frequency to voltage converting circuit at the predetermined voltage in accordance with the received output signal.

5. A frequency synthesizer as claimed in claim 1, wherein said output range controlling circuit includes a data converting circuit for receiving data for controlling the dividing ratio at said variable frequency dividing circuit and outputting a pair of digital signals in accordance with the input signals, a pair of digital to analog converters for individually converting the digital signal outputs of said data converting circuit into analog voltages, and a pair of bipolar transistors for individually receiving the output signals of said digital to analog converters and clipping the output voltage of said phase frequency to voltage converting circuit at two different predetermined voltages in accordance with the received output signals so that the output voltage of said phase frequency to voltage converting circuit to be applied to said low-pass filter may be within two different voltage values.

* * * * *